(12) United States Patent
Kurata

(10) Patent No.: US 8,354,638 B2
(45) Date of Patent: Jan. 15, 2013

(54) ELECTRON DETECTION DEVICE AND SCANNING ELECTRON MICROSCOPE

(75) Inventor: Tsuguo Kurata, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 12/931,899

(22) Filed: Feb. 14, 2011

(65) Prior Publication Data

US 2011/0139984 A1 Jun. 16, 2011

Related U.S. Application Data

(63) Continuation of application No. PCT/JP2008/002248, filed on Aug. 20, 2008.

(51) Int. Cl.
*G01N 23/00* (2006.01)
(52) U.S. Cl. ........ 250/311; 250/306; 250/307; 250/310; 250/396 R
(58) Field of Classification Search .................. 250/306, 250/307, 310, 311, 396 R, 397
See application file for complete search history.

(56) References Cited

U.S. PATENT DOCUMENTS

| 4,438,332 | A | 3/1984 | Lichtenegger |
| 6,667,478 | B2 | 12/2003 | Frosien et al. |
| 2003/0062478 | A1 | 4/2003 | Frosien et al. |
| 2003/0085361 | A1 | 5/2003 | Howells |
| 2005/0279937 | A1* | 12/2005 | Koike et al. .................. 250/310 |

FOREIGN PATENT DOCUMENTS

| DE | 3925949 A1 | 2/1991 |
| EP | 0362498 | 4/1990 |
| JP | 55-128242 | 10/1980 |
| JP | 63-110543 | 5/1988 |
| WO | WO 98/40906 | 9/1998 |

OTHER PUBLICATIONS

Office Action from the German Patent Office for the counterpart German patent application and its English translation.

* cited by examiner

*Primary Examiner* — Michael Maskell
*Assistant Examiner* — Hanway Chang
(74) *Attorney, Agent, or Firm* — Muramatsu & Associates

(57) ABSTRACT

An electron detection device including: one scintillator 31 having an opening through which an electron beam emitted from an electron gun passes; a plurality of photoguides 22 of the same shape, which are bonded to the scintillator and disposed symmetrically about an optical axis; and a photomultiplier tube which is connected to one side of each of the photoguides 22, the side opposing to the optical axis side, and converts light into electrical signals, the light being emitted by the scintillator 31 receiving light through the photoguide 22. The photoguides 22 are joined so as to equally divide the scintillator 31 symmetrically about the optical axis. Moreover, a position and an area of a portion bonded to the scintillator 31, in each of the photoguides 22, are the same among the photoguides 22.

7 Claims, 7 Drawing Sheets

Fig. 5G

| Inclination angle [degree] | Ia [%] | Ib [%] | Ic [%] | Id [%] |
|---|---|---|---|---|
| 0 | 25 | 25 | 25 | 25 |
| +45 | 50 | 20 | 10 | 20 |
| +85 | 80 | 10 | 0 | 10 |
| −45 | 10 | 20 | 50 | 20 |
| −85 | 0 | 10 | 80 | 10 |

ELECTRON DETECTION DEVICE AND SCANNING ELECTRON MICROSCOPE

CROSS-REFERENCE TO THE RELATED APPLICATION

This application is a continuation of prior International Patent Application No. PCT/JP2008/02248, filed Aug. 20, 2008, the entire contents of which are incorporated herein by reference.

BACKGROUND OF INVENTION

1. Technical Field

The present invention relates to an electron detection device and a scanning electron microscope. More particularly, the present invention relates to an electron detection device and a scanning electron microscope capable of detecting electrons emitted from a sample with high accuracy even in a low vacuum environment.

2. Background Art

In a manufacturing process of a semiconductor device, observation of a sample and measurement of a pattern line width and the like are performed by use of an electron beam device such as an electron microscope. In the observation or the measurement of the sample by use of the electron beam device, a portion to be observed is scanned while being irradiated with an electron beam. Thereafter, an amount of electrons such as secondary electrons is converted into luminance and then displayed as an image on a display device.

A generation region of the secondary electrons emitted from the sample supplied with energy from the electron beam is spread to approximately the same extent as a diffusion region of the incident electron beam. These secondary electrons have so low energy that the generated secondary electrons are detected within about 10 nm from the sample surface by a secondary electron detector. Such a device for detecting the secondary electrons basically includes a scintillator and a photomultiplier tube, and various forms thereof have been studied.

For example, U.S. Pat. No. 6,667,478 describes a detector for detecting emitted electrons, such as secondary electrons, emitted from a sample. This detector is disposed between an electron source and an objective lens. The detector is provided with a reflector for reflecting the electrons emitted from the sample, and a meshed electrode facing the reflector. The meshed electrode is axisymmetrically divided to obtain secondary electron information from each of segments.

Moreover, Japanese Laid-Open Publication No. 63-110543 describes a device using one detector including a hole whose center is located at an optical axis through which a primary electron beam passes.

As described above, the shape of the sample surface can be displayed by detecting the secondary electrons from the sample. Particularly, use of the plurality of detectors, as in the case of the secondary electron detector disclosed in U.S. Pat. No. 6,667,478, makes it possible to obtain information on an emission direction of the secondary electrons, and also to determine whether the sample surface is flat or inclined, and the like.

As another method for dividing and detecting such secondary electrons, a detector utilizing a microchannel plate (MCP) is widely used. The microchannel plate is a plate having micron-size cylindrical electron multipliers arranged adjacent to each other. The plate has its front and back surfaces coated with metal to serve as an input-side electrode (cathode) and an output-side electrode (anode), respectively. When a voltage is applied between the electrodes, electrons entering the input-side electrode collide with a channel inner wall to emit a plurality of secondary electrons. These secondary electrons are accelerated by an electric field within the channel and repeatedly collide with the channel inner wall. Accordingly, a multiplied electron current is outputted from the output-side electrode and serves as an amplified electrical signal.

As known in the art, in observation of a sample or measurement of a pattern line width and the like by use of a scanning electron microscope, irradiation of an electron beam is performed. However, the irradiation of the electron beam causes a phenomenon of charging the sample surface. Specifically, an irradiated surface is positively or negatively charged depending on a charge difference between charged particles made incident to the sample and charged particles emitted therefrom. When such charging occurs on the sample surface, the emitted secondary electrons are accelerated or drawn back to the sample. Accordingly, efficiency in emission of the secondary electrons is changed. As a result, there arises a problem of unstable quality of the image on the sample surface.

To cope with the above problem, ozone gas or nitrogen gas may be introduced into the device, for example, to prevent charging on the sample. However, introduction of the ozone gas or the like lowers a degree of vacuum inside the device.

The microchannel plate described above is intended for use in a high vacuum environment. Thus, in a low vacuum environment, accurate measurement becomes difficult due to contamination of noise into the photomultiplier tube, or the like.

Note that, in the detector described in U.S. Pat. No. 6,667,478, respective scintillators used in four secondary electron detectors do not necessarily have the same sensitivity. Moreover, in a case where the reflectors are used, not all secondary electrons can be collected by the secondary electron detectors. As described above, the secondary electrons emitted from the sample cannot be collected with certainty. Thus, there may occur an inconvenience that the sample surface cannot be accurately reproduced.

DISCLOSURE OF INVENTION

The present invention has been made in view of the above problems involved in the conventional technology. An object of the present invention is to provide an electron detection device and a scanning electron microscope which are capable of properly reproducing a sample surface condition even in a low vacuum environment with ozone gas and the like introduced therein.

The foregoing problems are solved by an electron detection device including: one scintillator having an opening through which an electron beam emitted from an electron gun passes; a plurality of photoguides of the same shape, which are bonded to the scintillator and disposed symmetrically about an optical axis of the electron detection device; and a photomultiplier tube which is connected to one side of each of the photoguides, the one side being opposite to that closer to the optical axis side, and converts light into an electrical signals, the light being emitted by the scintillator and transmitted through the photoguide. The photoguides are joined so as to equally divide the scintillator symmetrically about the optical axis. Moreover, a position and an area of a portion bonded to the scintillator, in each of the photoguides, are the same with one another.

In the above electron detection device, the number of regions in the scintillator divided by the plurality of photoguides may be at least two. Moreover, an opposite surface of the photoguide opposite to the scintillator may have a distance from the scintillator which becomes smaller toward the optical axis, and the opposite surface may form a reflection surface for reflecting the light. Furthermore, contact surfaces on which each of the photoguides mutually come into contact may form reflection surfaces for reflecting the light.

In the present invention, the device for detecting the emitted electrons such as secondary electrons or reflected electrons mainly includes the scintillator, the photoguides and the photomultiplier tubes. In this device, the scintillator has the opening on the optical axis through which the electron beam passes, and is formed in one piece that is axisymmetric in the vertical direction about the optical axis. The scintillator and the photoguides are bonded to each other, and the plurality of (for example, four) photoguides are arranged symmetrically about the optical axis. With the configuration as described above, even in a low vacuum environment with oxygen ($O_2$) gas or ozone ($O_3$) gas introduced therein, the electrons emitted from the sample are received by the scintillator and divided by the photoguides. Thus, detection of the emitted electrons, including directivity detection can be efficiently conducted. Consequently, the sample surface can be accurately detected.

Moreover, the foregoing problems are solved by a scanning electron microscope including the electron detection device. The scanning electron microscope further includes a control unit for receiving an output electrical signal from the photomultiplier tube and then calculating a secondary electron detection value for each of divided regions. The control unit may determine an inclination angle at a spot on a sample irradiated with the electron beam by referring to data indicating a relationship in each divided region between a ratio of the secondary electron detection value and an inclination angle at an irradiation position which have been previously measured by use of a sample having a known pattern inclination angle. Moreover, the scanning electron microscope further includes a display unit, and the control unit may receive an output electrical signal from the photomultiplier tube to display an image on the display unit by converting a secondary electron detection value at a spot on the sample irradiated with the electron beam into a luminance signal, and displays, on the display unit, information on an inclination angle at the spot on the sample.

In the present invention, the ratio of the detection value of the secondary electrons generated from the position of the sample irradiated with the electron beam is calculated for each of the divided regions. Thereafter, the inclination angle is determined based on the relationship between the ratio of the secondary electron detection value for each divided region and the inclination angle at the irradiation position, the information of which have been obtained in advance. Since the secondary electrons incorporating the shape information on the electron beam irradiation point are collected by the scintillator, the relationship between the ratio of the secondary electron detection value for each divided region and the inclination angle can be accurately calculated. Thereby, it is possible to easily and accurately determine the direction and degree as to the pattern is inclined on the basis of the ratio of the secondary electron detection amount for each of the divided regions.

BRIEF DESCRIPTION OF DRAWINGS

FIGS. 5A to 5G are views for explaining a relationship between a secondary electron distribution and an inclination angle.

BEST MODE FOR CARRYING OUT THE INVENTION

With reference to the drawings, an embodiment of the present invention will be described below.

(Configuration of Scanning Electron Microscope)

Figure 1:
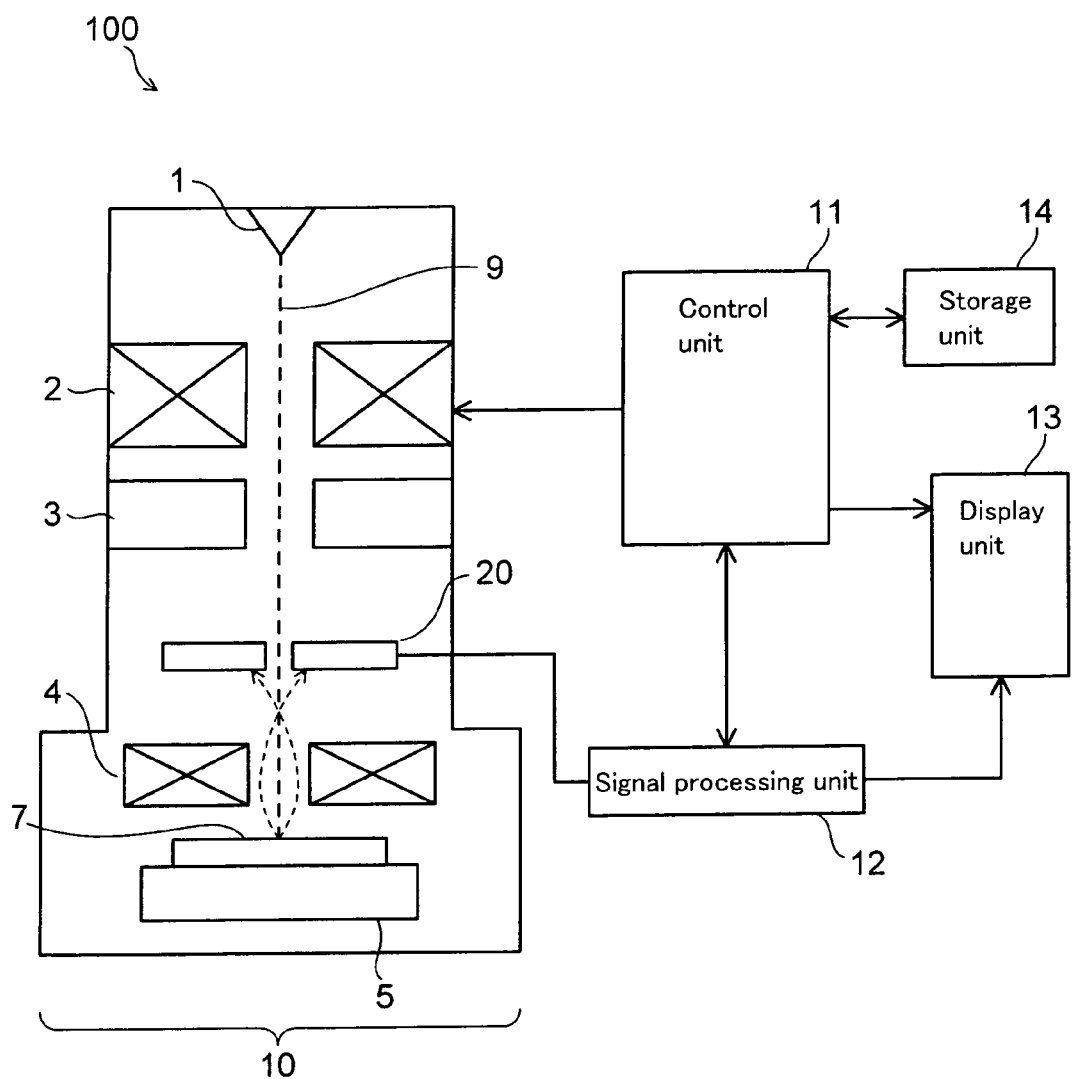
FIG. 1 is a schematic configuration diagram of a scanning electron microscope used in an embodiment of the present invention.

FIG. 1 is a configuration diagram of a scanning electron microscope 100 according to this embodiment. This scanning electron microscope 100 is mainly composed of an electron lens-barrel unit 10, a signal processing unit 12, a display unit 13, a storage unit 14 and a control unit 11 for controlling the electron lens-barrel unit 10, the signal processing unit 12, the display unit 13 and the storage unit 14.

The electron lens-barrel unit 10 has an electron gun 1, a condensing lens 2, a deflection coil 3, an objective lens 4 and an electron detector (electron detection device) 20. Moreover, a sample 7 is placed on a stage 5, and a motor (not shown) for moving the stage 5, a vacuum pump (not shown) for maintaining the inside of the electron lens-barrel at a predetermined reduced-pressure atmosphere and a gas introducer (not shown) for introducing ozone gas and the like to prevent charging on the sample are connected to the electron lens-barrel unit 10.

The sample 7 on the stage 5 is irradiated by an electron beam 9 emitted from the electron gun 1 through the condensing lens 2, the deflection coil 3 and the objective lens 4.

An amount of secondary electrons or reflected electrons emitted from the sample 7 upon irradiation of the electron beam 9 is detected by the electron detector 20 disposed between the deflection coil 3 and the objective lens 4. Thereafter, the amount detected is converted into a digital amount by an AD converter in the signal processing unit 12. Subsequently, the digital amount is further converted into a luminance signal and then displayed on the display unit 13. An amount of electron deflection by the deflection coil 3 and an amount of image scanning by the display unit 13 are controlled by the control unit 11.

The control unit 11 includes a microcomputer and stores a program for executing a process for measurement of a length such as a width of a pattern formed on the sample 7. Moreover, the control unit 11 determines an accelerating voltage of the electron beam 9 and applies the accelerating voltage to the electron gun 1 electrically connected thereto. Furthermore, the control unit 11 performs a process for determining a shape (inclination) of the pattern based on a relationship between the inclination of the pattern and a secondary electron distribution to be detected, the information of which have been obtained in advance and stored in the storage unit 14.

(Configuration of Electron Detector)

Next, with reference to FIGS. 2 and 3, a detailed configuration of the electron detector will be described. In this embodiment, consideration is given to the electron detector which is capable of (1) properly operating even in a low vacuum state, (2) specifying an emission direction of the secondary electrons and further (3) easily detecting the inclination of the pattern.

In a high vacuum environment, the emission direction of the secondary electrons can be specified by using a microchannel plate as noted above with respect to the conventional technology. Specifically, the microchannel plate is arranged above the sample so as to have a circular ring shape whose center is located in an optical axis. Moreover, the number of electrodes corresponding to a required number of divisions are connected to an output side of the microchannel plate. Thus, the emission direction of the secondary electrons can be detected.

In order to enable detection of the emission direction of the secondary electrons, as in the case of the use of the microchannel plate, in a low vacuum environment, a plurality of secondary electron detectors are used and arranged symmetrically about the optical axis. However, in this case, scintillators and the like used in the respective secondary electron detectors do not necessarily have the same performance. Moreover, depending on the arrangement of the secondary electron detectors, not all secondary electrons emitted from the sample can be collected.

Therefore, attention is focused on the following. Specifically, one scintillator is used so as not to cause a difference in performance, and the secondary electrons are converted into light. Thereafter, the light is divided and thereby the emission direction of the secondary electrons can be appropriately detected.

Figure 2:
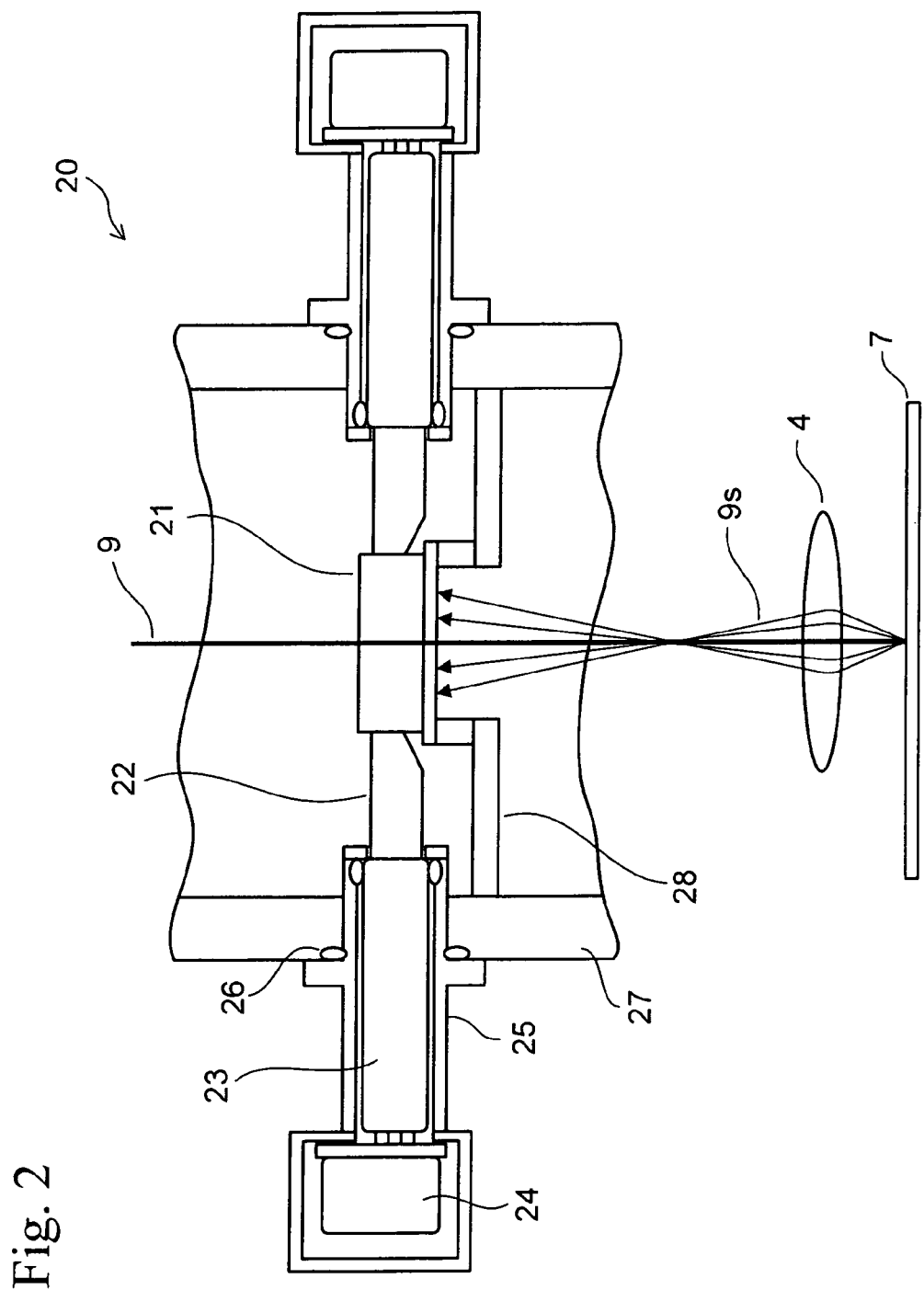
FIG. 2 is a cross-sectional view showing an electron detection device which detects emitted electrons such as secondary electrons in the scanning electron microscope shown in FIG. 1.

FIG. 2 is a view showing a configuration of the electron detector 20 for detecting the secondary electrons or reflected electrons (hereinafter collectively referred to as emitted electrons 9s) which are emitted from the sample 7 by irradiation of the electron beam 9. FIG. 2 schematically shows a cross-sectional view of the electron detector 20 installed in the electron lens-barrel unit 10.

The electron detector 20 is basically composed of: a light conversion part 21 for converting the secondary electrons collected by the scintillator into corresponding light; a plurality of photoguides for dividing the converted light symmetrically about the optical axis; a photomultiplier tube (PMT) for converting the light transmitted by each of the photoguides 22 into electrical signals; and an amplifier 24 for amplifying the converted electrical signals. The photomultiplier tube 23 is covered with light shielding case 25 that penetrates an outer wall part 27 of the electron lens-barrel 10, and is connected to the amplifier 24 disposed outside the electron lens-barrel 10. Moreover, a vacuum seal 26 connects between the light shielding case 25 and the electron lens-barrel 10, and between the light shielding case 25 and the photomultiplier tube 23.

Figure 3A:
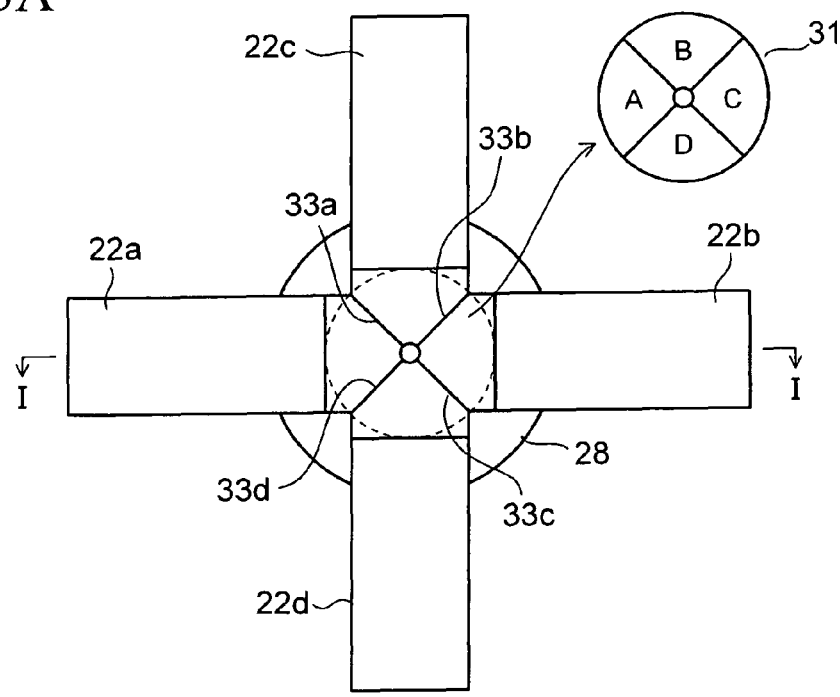
FIGS. 3A to 3C are configuration diagrams of the electron detection device using four photoguides.
Figure 3B:
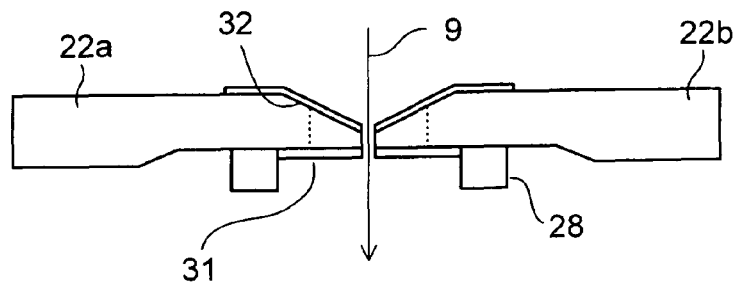
Figure 3C:
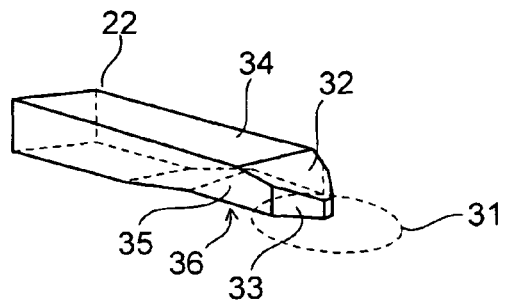

FIGS. 3A to 3C are configuration diagrams showing the photoguides 22 in the electron detector 20 having a four-division configuration. FIG. 3A is a plan view of the photoguides 22 in the electron detector 20. FIG. 3B is a cross-sectional view taken along the line I-I in FIG. 3A. FIG. 3C is a perspective view showing one of the photoguides 22 in the electron detector 20 having the four-division configuration.

As shown in FIG. 3A, four photoguides 22a to 22d are arranged in a cross shape symmetrically about the optical axis. Since these photoguides 22a to 22d are arranged adjacent to a scintillator 31, this configuration is equivalent to that having four electron detectors arranged therein. Specifically, the electron detector 22a collects the emitted electrons 9s from the sample 7 in a region A of the scintillator 31. The electron detector 22b collects the emitted electrons 9s from the sample 7 in a region C of the scintillator 31. The same goes for the electron detectors 22c (region B) and 22d (region D).

As shown in FIG. 3A, the scintillator 31 has a circular shape and has a circular opening at its center portion, through which the electron beam 9 emitted from the electron gun 1 passes. On the side of the scintillator 31 closer to the electron gun 1, the photoguides 22 are arranged adjacent to each other. The scintillator 31 is formed of a material which absorbs energy of the electrons emitted from the sample 7 and then generates fluorescence accordingly. For example, as the fluorescent material, a material which emits blue fluorescence and has an afterglow time of several micros or less is used.

Each of the photoguides 22 is made of, for example, glass or plastic and is disposed so as to have its one end come into contact with the scintillator 31. Moreover, at the other end of the photoguide 22, the photomultiplier tube 23 is disposed. The photoguides 22 are prepared for the number corresponding to the number of divisions of light to be outputted by the scintillator 31. Moreover, each of the photoguides 22 is arranged adjacent to the other photoguides 22 without leaving any space therebetween on the scintillator 31 side. In each of the photoguides 22, a portion coming into contact with the scintillator 31 is set so as not to block the light. The photoguides 22 and the scintillator 31 may be bonded to each other, for example, by use of an adhesive for an optical element, such as an optical cement.

Moreover, a surface 32 of the photoguide 22 opposite to that bonded to the scintillator 31 is formed into a tapered shape, i.e., a thickness of which is reduced toward the optical axis. The portion formed into the tapered shape is coated with aluminum or the like so as to reflect the light. Note that any portion other than the surface bonded to the scintillator 31 may be coated with reflectors.

The photomultiplier tube 23 has a configuration in which an electron multiplying part is built into a phototube. The photomultiplier tube 23 detects weak light, converts the light into electrical signals and amplifies the signals. Moreover, the photomultiplier tube 23 includes a photoelectric surface for converting light into electrons and an amplifying part for amplifying the electrons.

In the electron detector 20 thus configured, the electrons 9s emitted from the surface of the sample 7 by irradiation of the electron beam are collected by the scintillator 31 and converted into visible light by the scintillator 31. In order to efficiently collect the secondary electrons with low energy (generally, several 10 eV), a positive potential of about 10 kV with respect to the sample 7 is applied onto the scintillator 31. The converted visible light is guided to the photomultiplier tube 23 through the photoguides 22a to 22d connected to the scintillator 31. The visible light is converted into electrical signals by the photomultiplier tube 23 and the electrical signals are amplified by the amplifier 24. A secondary electron image is obtained by scanning the surface of the sample 7 with the electron beam and displaying a secondary electron intensity as a bright spot array on the display unit 13 in synchronization with the scanning.

Next, description will be given of the reason why the electron detector 20 described above can detect information including the emission direction of the secondary electrons and can also accurately detect the shape of the sample surface.

Figure 4A:
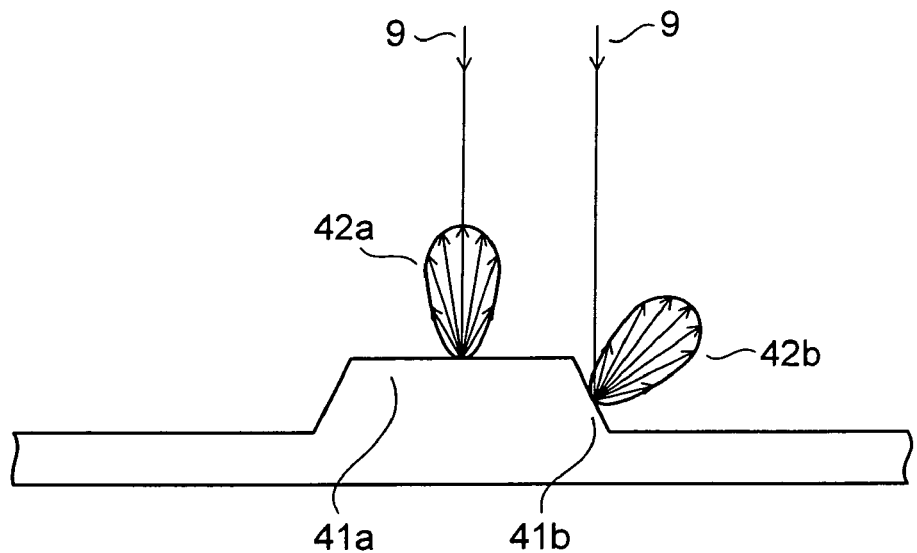
FIGS. 4A and 4B are schematic views showing a situation of emission of secondary electrons generated from a sample.
Figure 4B:
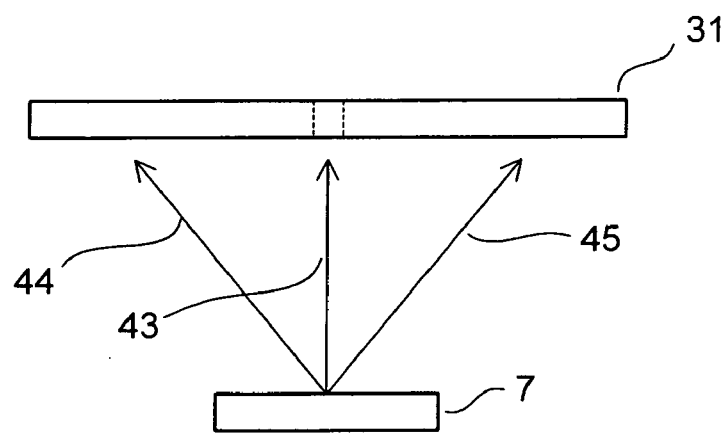

FIGS. 4A and 4B show a situation of emission of the secondary electrons generated from the sample 7. The secondary electrons are emitted by irradiation of primary electrons (the electron beam 9) onto the sample 7. Note that an emission amount of the secondary electrons varies depending on an angle of the sample surface. As shown in FIG. 4A, irradiation of the electron beam 9 onto a horizontal surface 41*a* of a pattern formed on the sample 7 results in emission distribution 42*a* of secondary electrons that is a distribution where a largest portion of the secondary electrons is emitted in a direction approximately perpendicular to the horizontal surface 41*a*. In contrast, irradiation of the electron beam 9 onto an inclined surface 41*b* leads to a distribution in which the largest amount of the secondary electrons are emitted in a direction approximately perpendicular to the inclined surface 41*b* as indicated by emission distribution 42*b* of the secondary electrons, although there are some deviations.

FIG. 4B shows that the secondary electrons emitted according to the inclined surface of the sample 7 have directivities. Specifically, when the electron beam is irradiated onto the horizontal surface 41*a* shown in FIG. 4A, the distribution shows that the largest amount of electrons 43 is emitted upward. In contrast, when the electron beam is irradiated onto the inclined surface 41*b* shown in FIG. 4A, the distribution shows that the largest amount of electrons 45 is emitted rightward. Moreover, when the electron beam is irradiated onto an inclined surface opposite to the inclined surface 41*b*, the distribution shows that the largest amount of electrons 44 is emitted leftward. Thus, as long as the upward, rightward and leftward distribution states described above can be detected, it is possible to determine whether the emitted electrons are from the flat surface or from the inclined surface.

In the electron detector 20 of this embodiment, as shown in FIG. 4B, the scintillator 31 is provided above the sample 7 so as to have the circular ring shape whose center is located at the optical axis. By applying a voltage for collecting the secondary electrons with small energy to the scintillator 31, the secondary electrons generated by irradiation of the electron beam onto the sample 7 can be collected.

The light converted by the scintillator 31 is guided to the PMT (photomultiplier tube) 23 by the four photoguides 22*a* to 22*d* and then converted into an electric current or the like corresponding to a secondary electron amount. The secondary electron amount at a spot on the irradiated sample 7 can be calculated by summing up the current amounts from these four divided regions. As described above, the secondary electrons can be collected and converted into the current amount. Thus, shape information on the surface of the sample 7 can be properly detected.

Furthermore, it is also possible to detect an inclination of the surface of the sample 7 (whether the surface is flat or in which direction and how much the surface is inclined) based on a ratio of the current amounts of the respective four divided regions. A method for recognizing such an inclination angle will be described below.

As described above, when the secondary electrons are emitted from the sample 7 by irradiation of the electron beam, there is a correlation between the inclination angle of the surface of the sample 7 and the distribution of the emitted secondary electrons. When these secondary electrons are collected by the scintillator 31, a position at which the secondary electrons collide with the scintillator 31 is determined according to the generation distribution of the secondary electrons. Therefore, there is a correlation between a ratio of a detection value to be outputted by each divided detector and the inclination of the pattern at the position where the secondary electrons are emitted.

FIGS. 5A to 5G are views for explaining a relationship between the amount of the secondary electrons detected and the inclination of the pattern. As shown in FIGS. 5A to 5E, a calibration sample having a known pattern inclination angle (alpha) is prepared in advance and is irradiated with the electron beam 9 to generate secondary electrons. Thereafter, a detection amount is measured by the electron detector. Subsequently, a ratio (%) of each of the divided regions is calculated based on the detection amount. Thus, a secondary electron distribution-inclination angle comparison table is created and stored in the storage unit 14.

Figure 5A:
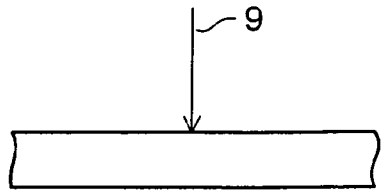
Figure 5B:
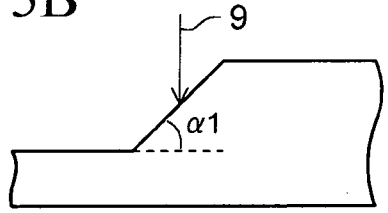
Figure 5C:
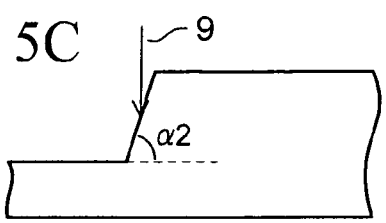
Figure 5D:
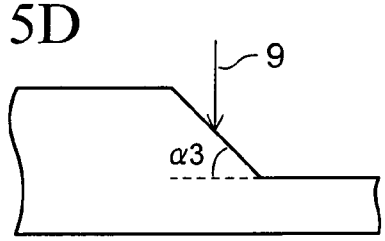
Figure 5E:
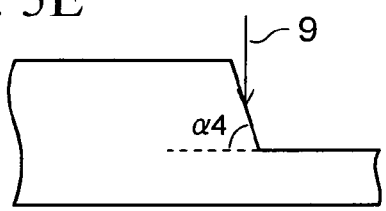
Figure 5F:
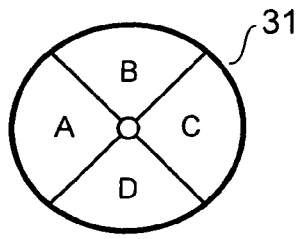

FIG. 5F shows the scintillator 31 in the electron detector 20 described with reference to FIGS. 3A to 3C as well as a state of the scintillator being divided into four divided regions A to D by joining the four photoguides 22*a* to 22*d*. Moreover, FIG. 5G shows an example of the secondary electron distribution-inclination angle comparison table at a predetermined irradiation position.

For example, when the inclination is 0 degree (flat) as in the case of the sample 7 shown in FIG. 5A, if a secondary electron detection amount Ia corresponding to the divided region A, a secondary electron detection amount Ib corresponding to the divided region B, a secondary electron detection amount Ic corresponding to the divided region C and a secondary electron detection amount Id corresponding to the divided region D are all the same, ratios (%) thereof are calculated as 25:25:25:25. Similarly, for example, in the case of a 45-degree upward inclination such as the pattern shown in FIG. 5B, the ratios are calculated as 50:20:10:20.

By referring to the values described above, the inclination angle at the position where the electron beam is irradiated can be easily detected.

Note that it is conceivable that, even if the inclination angles are the same, the position and the detection amount of the secondary electrons collected by the scintillator 31 vary, depending on the position, material or the like of the sample on which the electron beam is irradiated. In such a case, the inclination of the pattern cannot be accurately detected by use of the above table. Thus, the table taking into consideration of the irradiation position is prepared. For example, the above values are set as those at a center position (0, 0), the same pattern inclination is moved to a predetermined position (X1, Y1) and then secondary electron distribution at the position is measured. Thereafter, based on the distribution at the center position and the distribution at the predetermined position, distribution at an optional position therebetween is calculated. Subsequently, a table for the optional position is created and stored in the storage unit 14. The values at the center position and the values at the predetermined position described above may be stored in the storage unit 14 and the values at the optional position therebetween may be calculated for each measurement.

As described above, in this embodiment, the device for detecting the emitted electrons such as the secondary electrons or reflected electrons mainly includes the scintillator 31, the photoguides 22 and the photomultiplier tubes 23. In this device, the scintillator 31 has the opening at the optical axis through which the electron beam 9 passes, and is formed in one piece that is axisymmetric in the vertical direction about the optical axis. The scintillator 31 and the photoguides 22 are bonded to each other, and the plurality of (for example, four) photoguides 22 are arranged symmetrically about the optical axis. With the configuration as described above, accurate detection of the emitted electrons including directivity detection becomes possible, since all the electrons emitted from the sample are received by the scintillator and divided by the photoguides, even in a low vacuum environment with $O_2$ or $O_3$ gas introduced therein. Thus, the sample surface can be accurately detected. Moreover, between the plurality of photoguides, the reflectors are provided so that light is reflected to the inside of each photoguide in the mutually contacting portion of the photoguides. Thus, no crosstalk occurs and the secondary electron amount in each region can be accurately detected.

Moreover, in the scanning electron microscope of this embodiment, the ratio of the detection value of the secondary electrons generated from the position of the sample irradiated with the electron beam is calculated for each of the divided regions. Thereafter, the inclination angle is determined based on a relationship between the ratio of the secondary electron detection value for each divided region and the inclination angle at the irradiation position, the information of which have been obtained in advance. Since the secondary electrons incorporating the shape information on the electron beam irradiation point are collected by the scintillator, the relationship between the ratio of the secondary electron detection value for each divided region and the inclination angle can be accurately calculated. Thereby, it is possible to easily and accurately determine the direction and degree as to the pattern is inclined on the basis of the ratio of the secondary electron detection amount for each of the divided regions.

Note that, in this embodiment, the description has been made for the case, as an example, where the four photoguides are arranged on the scintillator. However, the present invention is not limited to this configuration. Namely, at least two or more photoguides may be axisymmetrically arranged.

Figure 6A:
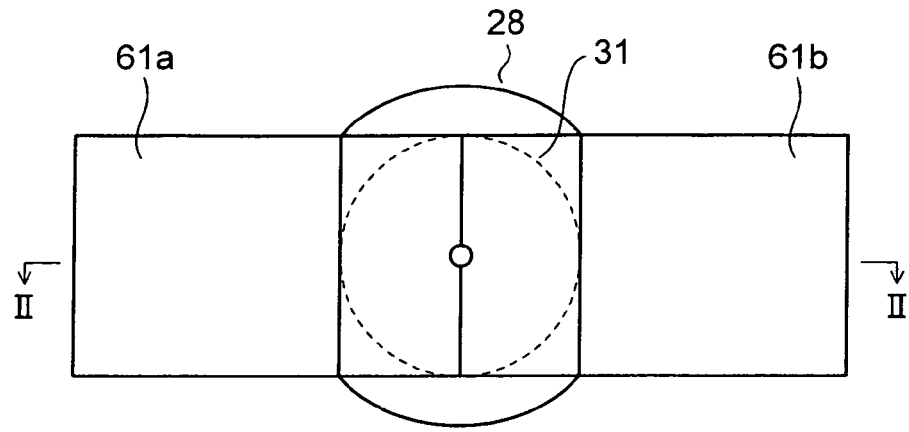
FIGS. 6A to 6C are views showing other examples of the electron detection device.
Figure 6B:
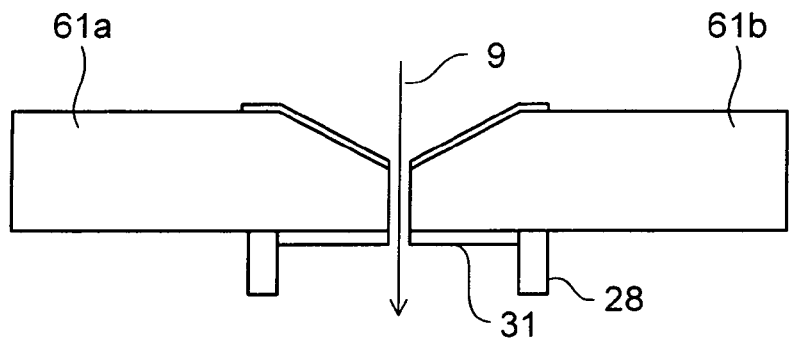
Figure 6C:
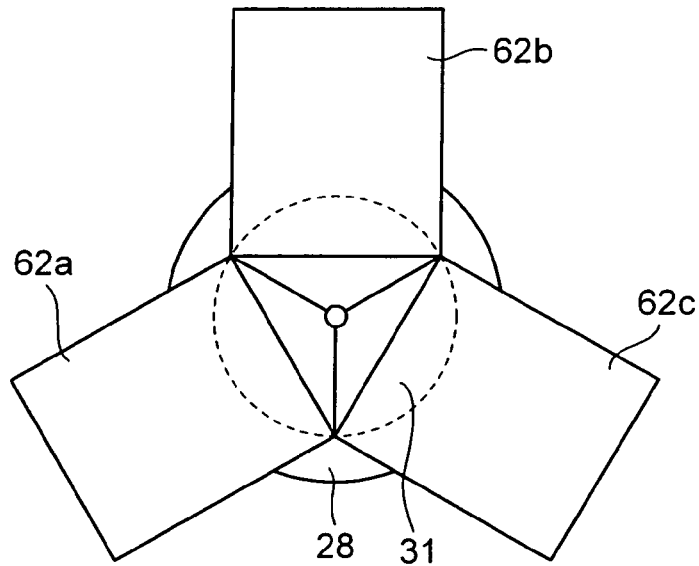

FIGS. 6A and 6B show an example of use of two photoguides and FIG. 6C shows an example of use of three photoguides. FIG. 6A is a plan view of a photoguide portion in the electron detector 20. FIG. 6B is a cross-sectional view taken along the line II-II in FIG. 6A.

As shown in FIG. 6A, photoguides 61a and 61b are disposed on the scintillator 31. The photoguides 61a and 61b partially come into contact with each other so as to divide the scintillator 31 into two halves. As in the case of FIG. 3 where the four photoguides are used, in order to efficiently guide light converted by the scintillator 31 to a photomultiplier tube, surfaces opposite to the scintillator 31 are inclined so as to have a tapered shape toward the optical axis. Moreover, portions of the surfaces of the photoguides 61a and 61b other than the surfaces coming into contact with the scintillator 31 are coated with reflectors.

Emitted electrons received on the left side of the scintillator 31 shown in FIGS. 6A and 6B are converted into light by the scintillator 31 and then inputted to the photomultiplier tube by the photoguide 61a. Similarly, emitted electrons received on the right side of the scintillator 31 shown in FIGS. 6A and 6B are converted into light by the scintillator 31 and then inputted to the photomultiplier tube by the photoguide 61b.

In FIG. 6C, light converted by the scintillator 31 is divided into three parts and the lights divided by photoguides 62a to 62c, respectively, are guided to the photomultiplier tube.

In both of the cases where the light is divided into two parts and where the light is divided into three parts as described above, data concerning known pattern shapes and secondary electron distributions is previously obtained as in the case of the electron detector 20 shown in FIG. 3 where the light is divided into four parts. Thus, information on the inclination angle of the pattern can be easily obtained. Moreover, detailed information on the direction of the emitted electrons collected can be obtained by increasing the number of the photoguides and thus increasing the number of the divided regions of the scintillator.

Moreover, in this embodiment, the description was given of the secondary electron detector intended for use in the low vacuum environment. However, as a matter of course, the detector can be used in a high vacuum environment.

Moreover, the photoguide in the secondary electron detector of this embodiment has been described with respect to the example having a shape of a square prism in a tapered shape on the side in contact with the scintillator. However, the present invention is not limited to this configuration. Namely, any shape that can guide the light emitted by the scintillator to the photomultiplier tube may be employed. For example, the tapered part may be formed to have multiple stages or an optical fiber may be used.

(Pattern Shape Observation Method)

Figure 7:
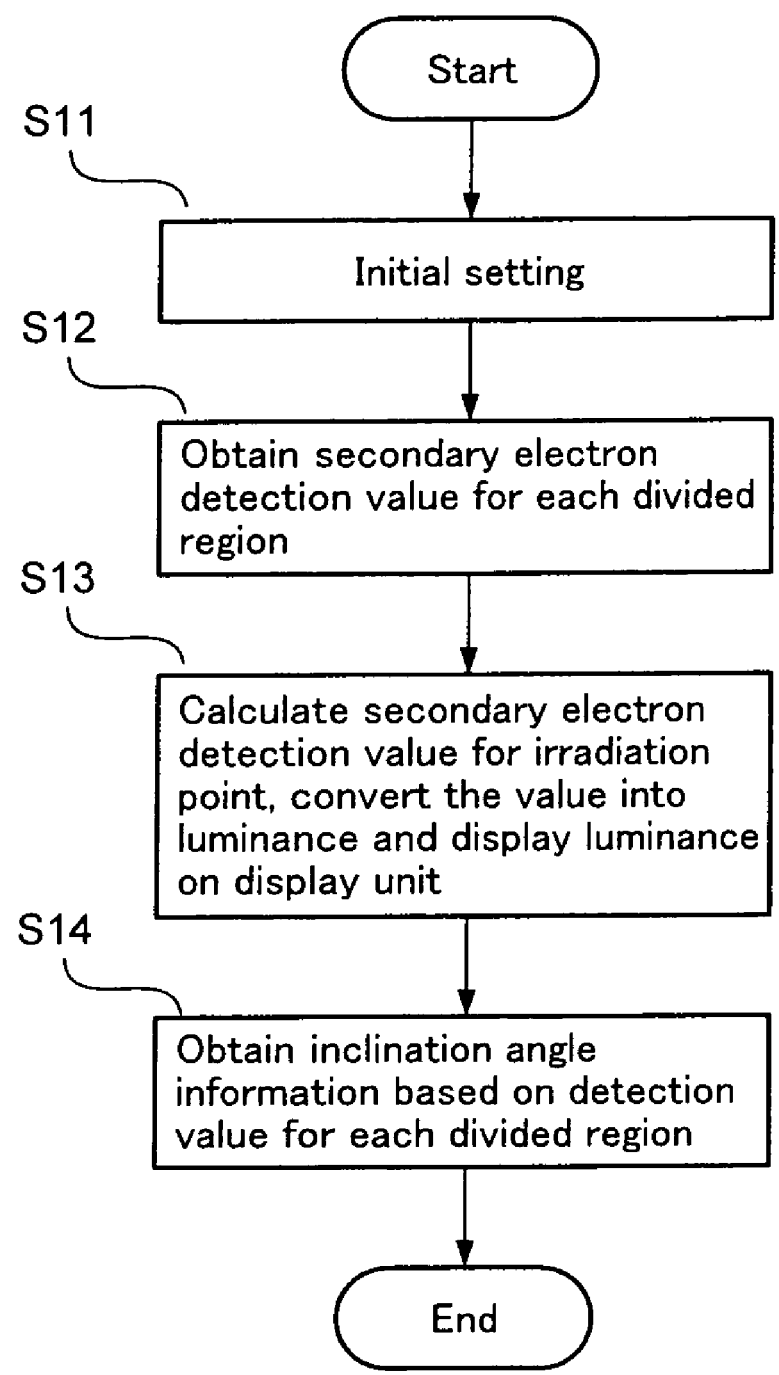
FIG. 7 is a flowchart showing an example of a method of observing a pattern shape.

Next, with reference to a flowchart of FIG. 7, description will be given of a method of observing a shape of a pattern formed on the sample 7 by use of the scanning electron microscope 100 including the electron detector 20 according to this embodiment. Note that a secondary electron distribution-inclination angle comparison table has been previously created and stored in the storage unit 14 before this observation processing is performed.

First, in Step S11, initial setting is performed. In this initial setting, the number of divided regions of the scintillator 31 is determined and the secondary electron distribution-inclination angle comparison table corresponding to the number is selected.

Next, in Step S12, a secondary electron detection value is obtained for each of the divided regions. Thereafter, emitted electrons from the sample 7 upon irradiation of the electron beam onto the sample 7 are received by the scintillator 31 and then converted into light by the scintillator 31. Subsequently, a signal output value of the emitted electrons detected for each of the divided regions is obtained through a photoguide disposed for each of the divided regions of the scintillator 31 and a photomultiplier tube.

Thereafter, in Step S13, a secondary electron detection value at an irradiation point is calculated, converted into luminance and then displayed on the display unit 13. The secondary electron detection value at the irradiation point is calculated by summing up the secondary electron detection values for the respective divided regions in Step S12. Furthermore, an SEM image is obtained by conversion into luminance corresponding to the secondary electron detection values and then displayed on the display unit 13.

Subsequently, in Step S14, information on the inclination angle is obtained based on the detection value for each of the divided regions. Moreover, based on the secondary electron detection value for each divided region obtained in Step S12, a ratio of the secondary electron detection value for each region is calculated. By referring to the calculated ratio and the secondary electron distribution-inclination angle comparison table stored in the storage unit 14, inclination angle information on the irradiation position is obtained. Moreover, pattern inclination angle information may be displayed on the SEM image in accordance with the obtained information.

Thus, the processing from Step S12 to Step S14 is performed while scanning the sample with irradiation of the electron beam. This processing is terminated when scanning is finished for a range of the sample to be observed.

What is claimed is:

1. An electron detection device for detecting electrons emitted from a sample, comprising:
   one scintillator arranged to face the sample, the scintillator having an opening through which an electron beam emitted from an electron gun passes;
   a plurality of photoguides of the same shape, which are bonded to a side of the scintillator closer to the electron gun and disposed symmetrically about an optical axis of the electron detection device; and a photomultiplier tube which is connected to one side of each of the photoguides, the side being opposite to that closer to the optical axis, and converts light into electrical signals, the light being emitted by the scintillator and transmitted to the photomultiplier tube through the photoguide, wherein the photoguides are joined so as to equally divide the scintillator symmetrically about the optical axis, and a position and an area of a portion bonded to the scintillator, in each of the photoguides, are the same with one another.

2. The electron detection device according to claim 1, wherein, a number of regions in the scintillator divided by the plurality of photoguides is at least two.

3. The electron detection device according to claim 1, wherein, an opposite surface of the photoguide opposite to the scintillator has a distance from the scintillator which becomes smaller toward the optical axis, and the opposite surface forms a reflection surface for reflecting the light.

4. The electron detection device according to claim 1, wherein, contact surfaces on which each of the photoguides mutually come into contact form reflection surfaces for reflecting the light.

5. A scanning electron microscope comprising:

an electron gun for generating an electron beam and irradiating the electron beam on a sample to be observed;

a stage for mounting the sample thereon and moving the sample on a horizontal plane; and an electron detection device provided between the electron gun and the stage for detecting electrons emitted from the sample when irradiated by the electron beam, said electron detection device comprising:

one scintillator arranged to face the sample, the scintillator having an opening through which the electron beam emitted from the electron gun passes;

a plurality of photoguides of the same shape, which are bonded to a side of the scintillator closer to the electron gun and disposed symmetrically about an optical axis of the electron detection device; and a photomultiplier tube which is connected to one side of each of the photoguides, the side being opposite to that closer to the optical axis, and converts light into electrical signals, the light being emitted by the scintillator and transmitted to the photomultiplier tube through the photoguide;

wherein the photoguides are joined so as to equally divide the scintillator symmetrically about the optical axis, and a position and an area of a portion bonded to the scintillator, in each of the photoguides, are the same with one another.

6. The scanning electron microscope according to claim 5 further comprising:

a control unit for receiving an output electrical signal from the photomultiplier tube and then calculating a secondary electron detection value for each of divided regions, wherein, the control unit determines an inclination angle at a spot on the sample irradiated with the electron beam by referring to data indicating a relationship in each divided region between a ratio of the secondary electron detection value and an inclination angle at an irradiation position which have been obtained in advance with use of a sample having a known pattern inclination angle.

7. The scanning electron microscope according to claim 6 further comprising:

a display unit, wherein, the control unit receives an output electrical signal from the photomultiplier tube to display an image on the display unit by converting a secondary electron detection value for a spot on the sample irradiated with the electron beam into a luminance signal, and displays, on the display unit, information on an inclination angle at the spot on the sample.

* * * * *